(12) United States Patent
Mostafazadeh et al.

(10) Patent No.: US 7,288,439 B1
(45) Date of Patent: Oct. 30, 2007

(54) LEADLESS MICROELECTRONIC PACKAGE AND A METHOD TO MAXIMIZE THE DIE SIZE IN THE PACKAGE

(75) Inventors: Shahram Mostafazadeh, San Jose, CA (US); Gerald Alexander Fields, Saratoga, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 177 days.

(21) Appl. No.: 11/123,567

(22) Filed: May 5, 2005

Related U.S. Application Data

(62) Division of application No. 10/458,433, filed on Jun. 9, 2003, now Pat. No. 6,894,376.

(51) Int. Cl.
*H01L 21/00* (2006.01)

(52) U.S. Cl. .............. 438/123; 438/110; 438/111; 438/112; 438/113; 438/121; 438/124

(58) Field of Classification Search ........ 438/110–113, 438/121, 123, 124
See application file for complete search history.

(56) References Cited

U.S. PATENT DOCUMENTS

| | | | |
|---|---|---|---|
| 6,143,981 A | 11/2000 | Glenn | |
| 6,281,568 B1 | 8/2001 | Glenn et al. | |
| 6,414,385 B1 | 7/2002 | Huang et al. | |
| 6,424,024 B1 * | 7/2002 | Shih et al. | 257/667 |
| 6,448,633 B1 | 9/2002 | Yee et al. | |
| 6,452,255 B1 | 9/2002 | Bayan et al. | |
| 6,498,099 B1 | 12/2002 | McLellan et al. | |
| 6,559,525 B2 | 5/2003 | Huang | |
| 6,650,020 B2 * | 11/2003 | Yamada et al. | 257/783 |
| 6,759,737 B2 | 7/2004 | Seo et al. | |
| 2002/0031869 A1 * | 3/2002 | Minamio et al. | 438/127 |
| 2002/0039808 A1 * | 4/2002 | Fukutomi et al. | 438/106 |
| 2002/0041019 A1 | 4/2002 | Gang | |
| 2002/0056856 A1 | 5/2002 | McLellan et al. | |
| 2002/0084534 A1 | 7/2002 | Paek | |
| 2003/0001244 A1 * | 1/2003 | Araki et al. | 257/666 |
| 2003/0001252 A1 | 1/2003 | Ku et al. | |
| 2003/0003627 A1 * | 1/2003 | Yamaguchi et al. | 438/123 |
| 2003/0203539 A1 | 10/2003 | Islam et al. | |
| 2003/0214048 A1 | 11/2003 | Wu et al. | |

\* cited by examiner

*Primary Examiner*—Zandra V. Smith
*Assistant Examiner*—Bac H. Au
(74) *Attorney, Agent, or Firm*—Beyer Weaver LLP

(57) ABSTRACT

Arrangements and methods of packaging integrated circuits in leadless leadframe packages configured for maximizing a die size are disclosed. The package is described having an exposed die attach pad and a plurality of exposed contacts formed from a common substrate material. The contacts, however, are thinned relative to the die attach pad. In one embodiment, an inner region of the contacts is thinned. In another embodiment, an outer region of the contacts is also thinned. A die is mounted on the die attach pad and wire bonded to the contacts. Since the inner region and sometimes together with the outer region of the contact are lower than the die attach pad being wire bonded to, the size of the die can be relatively increased to overhang over the contact, thereby maximizing the die size in the package. A plastic cap is molded over the die, contacts, and bonding wires while leaving the bottom surface of the contacts exposed.

15 Claims, 9 Drawing Sheets

LEADLESS MICROELECTRONIC PACKAGE AND A METHOD TO MAXIMIZE THE DIE SIZE IN THE PACKAGE

CROSS-REFERENCE TO RELATED APPLICATIONS

This application is a Divisional of U.S. patent application Ser. No. 10/458,433, filed on Jun. 9, 2003 now U.S. Pat. No. 6,894,376, which is incorporated herein by reference.

FIELD OF THE INVENTION

The present invention relates generally to the bulk packaging of integrated circuits. More particularly, the invention relates to leadless leadframe packaging designs and processes that allow for maximizing the die size.

BACKGROUND OF THE INVENTION

A leadless leadframe package (LLP) is a relatively new integrated circuit package design that contemplates the use of a metal (typically copper) leadframe type substrate structure in the formation of a chip scale package (CSP). As illustrated in FIGS. 1A-1C, in typical leadless leadframe packages, a copper leadframe strip or panel 101 is patterned (typically by stamping or etching) to define a plurality of arrays 103 of chip substrate features. Each chip substrate feature includes a die attach pad 107 and a plurality of contacts 109 disposed about their associated die attach pad 107. Tie bars 111 are used to support the die attach pads 107 and contacts 109.

During assembly, dice are attached to the respective die attach pads and conventional wire bonding is used to electrically couple bond pads (not shown) on each die to their associated contacts 109 on the leadframe strip 101. After the wire bonding, a plastic cap is molded over the top surface of the each array 103 of wire bonded dice. The dice are then singulated and tested using conventional sawing or punching and testing techniques.

FIG. 2 illustrates a typical resulting leadless leadframe package. The die attach pad 107 supports a die 120 which is electrically connected to its associated contacts 109 by bonding wires 122. A plastic cap 125 made of molding material encapsulates the die 120 and bonding wires 122 and fills the gaps between the die attach pad 107 and the contacts 109 thereby serving to hold the contacts in place. It should be appreciated that during singulation, the tie bars 111 are cut and therefore the only materials holding the contacts 109 in place is the molding material. The resulting packaged chip, with the exposed contacts 109 on the bottom of the package, can then be surface mounted on a printed circuit board or other substrate using conventional techniques.

Although leadless leadframe packaging has proven to be a cost effective packaging arrangement, there are continuing efforts to further improve the package structure and associated processing in order to better utilize the space within the resulting devices. Currently, device substrate features often have the same thickness. As such, a die often attaches to a die attach pad that has a same thickness as the surrounding contacts in the device. Therefore, in order to avoid short-circuiting the device, the die size can only be effectively maximized to overhang the die attach pad to the extent of approximately where the inner edge of the contacts is located.

Improved leadless leadframe packaging arrangements and methods that efficiently maximize the die size and easily integrate with current processing techniques are therefore needed.

SUMMARY OF THE INVENTION

To achieve the foregoing and other objects and according to the purpose of the present invention, a variety of leadless packaging arrangements and methods of packaging integrated circuits in leadless packages are disclosed.

In one aspect of the invention, a leadless leadframe for maximizing a die size in semiconductor packaging includes a die attach pad and a plurality of corresponding electrical contacts surrounding the die attach pad. Each of the contacts has an inner region and an outer region. The outer region is a portion of the contact positioned horizontally adjacent to the periphery of the device area whereas the inner region is a portion of the contact positioned horizontally adjacent to the die attach pad and has a vertical height that is less than that of the die attach pad.

In another aspect of the invention, a method of packaging integrated circuits for maximizing a die size in semiconductor packaging includes forming a plurality of device areas arranged in a two dimensional array and suspended within an electrically conductive substrate. Each of the device areas has a die attach pad and a plurality of corresponding electrical contacts surrounding the die attach pad where each of the contacts has an inner region and an outer region. The outer region is a portion of the contact positioned horizontally adjacent to the periphery of the device area and has a vertical height that is less than that of the die attach pad whereas the inner region is a portion of the contact positioned horizontally adjacent to both the die attach pad and the outer region and has a vertical height that is less than that of the die attach pad.

In yet another aspect of the invention, a leadless leadframe package for maximizing a die size includes a top surface; a bottom surface opposite the top surface; a die attach pad embedded within the leadless leadframe package; a die positioned over the die attach pad; a plurality of corresponding electrical contacts surrounding the die attach pad where each of the contacts has an inner region and an outer region; a plurality of bonding wires that electrically connect the die to the plurality of corresponding electrical contacts; and a molding cap covering the bonding wires, die, and contacts. The outer region is a portion of the contact positioned horizontally adjacent to the periphery of the leadless leadframe package whereas the inner region is a portion of the contact positioned horizontally adjacent to the die attach pad and has a vertical height that is less than that of the die attach pad.

In one embodiment, the inner region and the outer region are adjacent to each other. The inner region and the outer region may have the same vertical height. In another embodiment, the outer region may have a vertical height that is less than that of the die attach pad. Generally, however, both the inner and the outer regions can assume any physical shape.

Finally, another aspect of the invention is a semiconductor package for maximizing a die size made by the process of forming a plurality of device areas arranged in a two dimensional array and suspended within an electrically conductive substrate. Each of the device areas has a die attach pad; and a plurality of corresponding electrical contacts surrounding the die attach pad where each of the contacts has an inner region and an outer region. The outer region is a portion of the contact positioned horizontally adjacent to the periphery of the device area whereas the inner region is positioned horizontally adjacent to the die attach pad and has a vertical height that is less than that of the die attach pad.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

A number of improved leadless package designs are described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Generally, the size of the die in semiconductor packages is determinative upon the clearances it has with the surrounding components within the semiconductor package. In leadless leadframe packages, however, this may include such components as the plurality of electrical contacts that surround a corresponding die attach pad, which supports the die. By providing contacts that are relatively lower than the height of the die attach pad, the die can overhang the edges of the die attach pad and over above the plurality of electrical contacts. Therefore, the die size in the semiconductor package can be maximized.

Figure 1A:
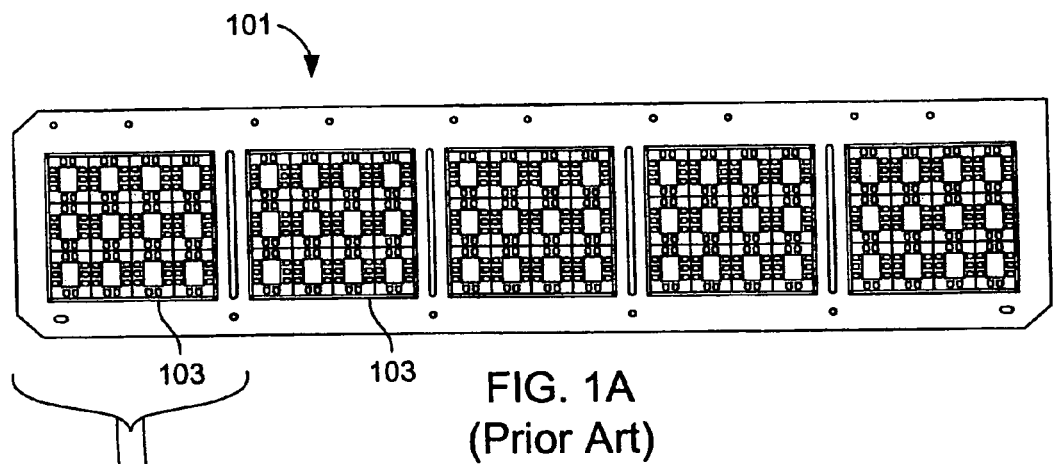
FIGS. 1A-1C are diagrammatic top views of a conventional lead frame strip suitable for use in forming leadless leadframe packages.
Figure 1B:
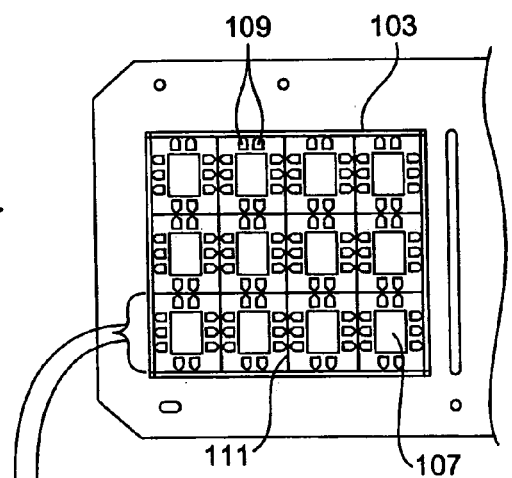
Figure 1C:
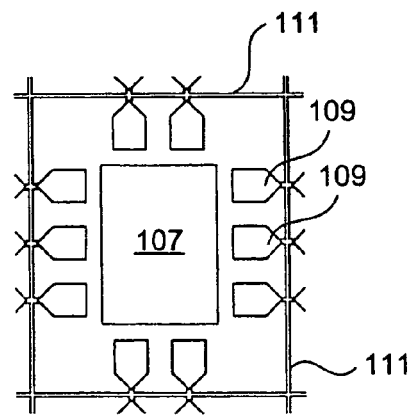
Figure 2:
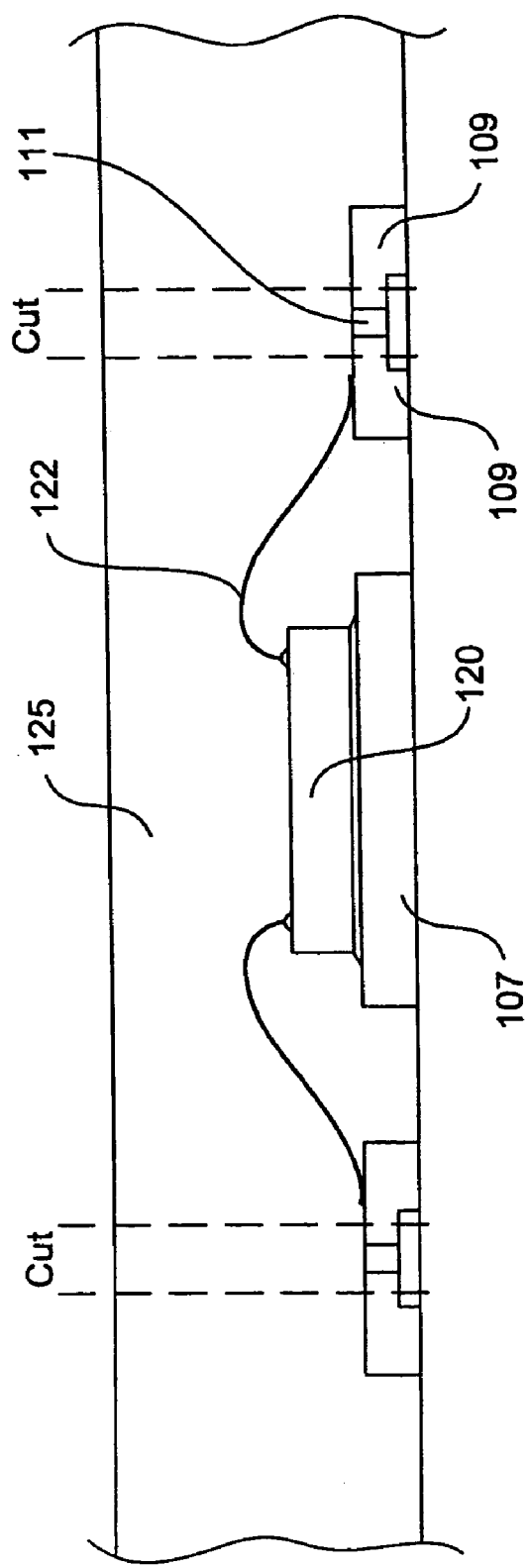
FIG. 2 is a diagrammatic cross sectional side view of a conventional leadless leadframe package.
Figure 3:
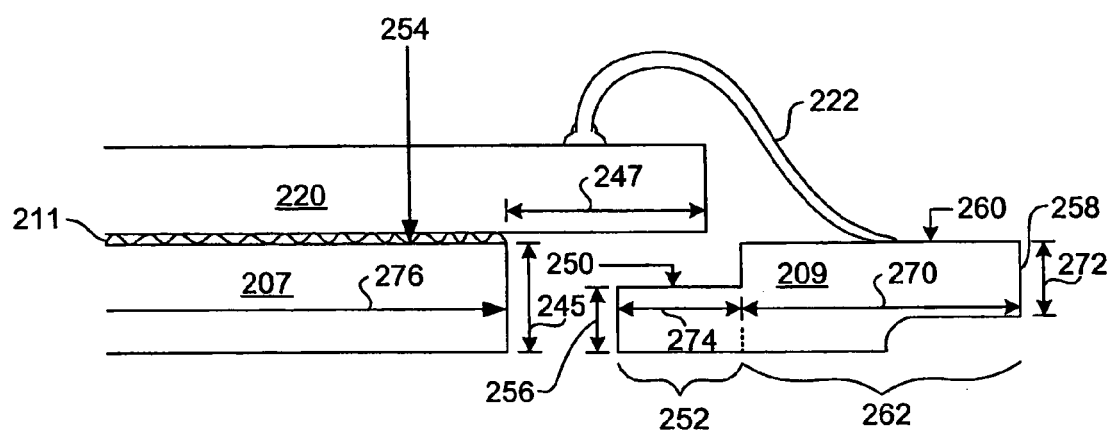
FIG. 3 is a diagrammatic cross sectional partial side view of a die maximizing leadless leadframe package design illustrating the inner and outer regions of an electrical contact in accordance with one embodiment of the present invention.

Referring initially to FIG. 3, a first embodiment of the present invention will be described. FIG. 3 is a diagrammatic cross sectional partial side view of a die maximizing leadless leadframe package design illustrating the inner region 252 and outer region 262 of an electrical contact 209 in accordance with one embodiment of the present invention. In this embodiment, the leadless package may (but need not) be produced quite similarly to the conventional leadless package illustrated in FIG. 2. Generally, inner region 252 is the portion of contact 209 that is positioned closer to the die attach pad 207 whereas outer region 262 is the portion of contact 209 that is positioned closer to the periphery of the leadless semiconductor package. Typically, inner region 252 and outer region 262 together form the entire contact 209. However, the thickness of at least the inner region of the contact 209 is reduced relative to the thickness of die attach pad 207. With this arrangement, die 220 can be attached to die attach pad 207 with an adhesive 211 (e.g., conductive epoxy, non-conductive epoxy) where it will sit higher in the package such that the die size is maximized accordingly in the efficient utilization of space within the package.

In one embodiment, inner region 252 corresponds to a portion of contact 209 that is positioned adjacent to die attach pad 207 and has a top surface 250 that is lower than a top surface 254 of die attach pad 207. Generally, inner region 252 does not include the portion of contact 209 where bonding wire 222 is designated for attaching. However, inner region 252 often corresponds to the portion of contact 209 that is configured in such a way that will allow a die 220 to be positioned on die attach pad 207 where it overhangs and encroaches into the space above inner region 252 while not making direct physical contact with inner region 252. In an alternative embodiment, inner region 252 corresponds only to the portion of contact 209 where die 220 actually encroaches over into the space above inner region 252 without ever making direct physical contact with inner region 252 (e.g., see FIG. 4).

On the other hand, outer region 262 corresponds to a portion of contact 209 that is often positioned adjacent to both inner region 252 and the periphery of the leadless leadframe package. In other words, inner region 252 is the portion of contact 209 that is in between the outer region 262 and die attach pad 207. Outer region 262 may even include the portion of contact 209 that extends away from die attach pad 207 and towards the outer periphery of the leadless leadframe package such that an end surface 258 is exposed on the periphery of the leadless leadframe package. Typically, outer region 262 includes the portion of contact 209 where bonding wire 222 is designated for attaching. Outer region 262 has a horizontal width 270 suitable for making electrical contact with bonding wire 222. In various embodiments, the horizontal width 270 is 0.4 mm or more. However, as semiconductor and packaging processes improve, this dimension can be made smaller, for example less than 0.4 mm. Furthermore, outer region 262 has a top surface 260 that is configured as necessary to allow for maximizing the size of die 220. For example, top surface 260 may be positioned or formed at either a higher (e.g., FIG. 3), a lower (not illustrated), or substantially the same (e.g., FIG. 4) level relative to that of top surface 250 of inner region 252. In one embodiment, the levels of the top surfaces of both inner region 252 and outer region 262 are coordinated to allow die 220 to be positioned above without making direct physical contact with it.

Figure 4:
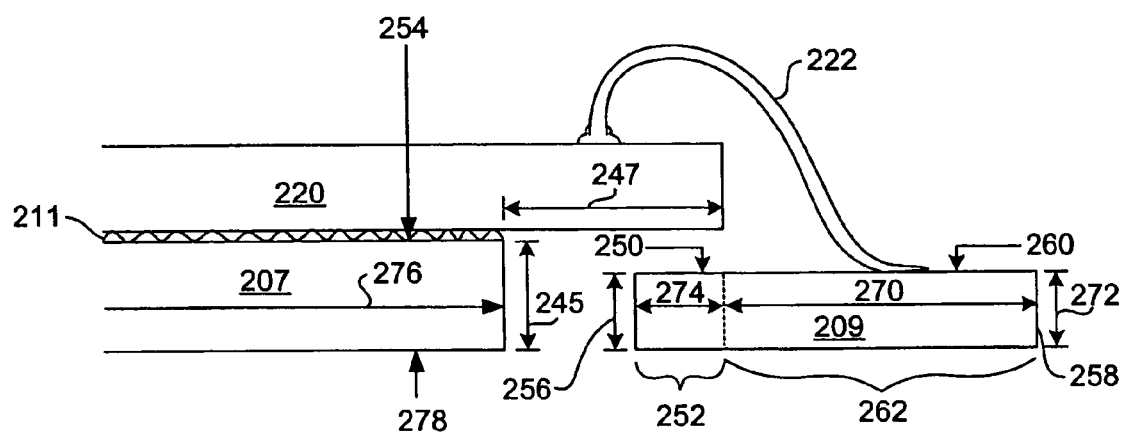
FIG. 4 is a diagrammatic cross sectional partial side view of a die maximizing leadless leadframe package design illustrating the inner and outer regions of an electrical contact in accordance with a second embodiment of the present invention.

FIG. 4 is a diagrammatic cross sectional partial side view of a die maximizing leadless leadframe package design illustrating the inner and outer regions of an electrical contact in accordance with a second embodiment of the present invention. FIG. 4 is similar to FIG. 3 except for a few differences. One difference is that inner region 252 and outer region 262 have respective top surfaces 250 and 260 that are substantially at the same level, which are lower than the top surface 254 of die attach pad 207. This arrangement will allow die 220 to be attached to the die attach pad 207 such that die 220 may overhang die attach pad 207 and protrude outward towards the periphery of the leadless leadframe package. The protrusion 247 (e.g., overhang) may encroach into the space above either inner region 252, outer region 262, or both regions 252 and 262. Typically, the amount of protrusion will depend on the size of the leadless leadframe package and the arrangement of the corresponding components. For example, protrusion 247 should not encroach over any space above either inner region 252 or outer region 262 that will prevent adequate attachment of bonding wire 222 to contact 209. In any case, this arrangement will allow the ability to maximize the die size while preventing die 220 from making direct physical contact with contact 209. In a preferred embodiment, protrusion 247 will allow a package body size to be about 0.5 mm greater than the die size.

As can be imagined, inner region 252, outer region 262, and die attach pad 207 may assume any physical shape (e.g., a rectangular bar or a wedge) provided that at least top surface 250 and possibly top surface 260 is/are positioned lower than top surface 254 and that die 220 does not come into direct physical contact with inner region 252 (and possibly region 262). As such, electrical shorting and electrical leakage issues between die 220 and contact 209 can be significantly reduced or avoided. The physical shapes may also have leveled, unleveled, even, or uneven surfaces. In one embodiment, inner region 252 and outer region 262 have even leveled top surfaces such as that shown on FIG. 3 and FIG. 4.

A number of vertical heights (e.g., 256, 272, 245) and horizontal widths (e.g., 274, 270, 276) are shown in both FIG. 3 and FIG. 4. In one embodiment, the vertical heights are measured from a common plane such as the bottom surface of the leadless leadframe package. Since die attach pad 207 has a bottom surface 278 that is typically exposed and coplanar with the bottom surface of the leadless leadframe package, bottom surface 278 can be used as the common plane for measuring the vertical heights. Therefore, in one embodiment of the present invention, vertical height 256 is smaller in value than vertical height 245. As such, top surface 250 is lower than top surface 254.

As will be appreciated by those skilled in the art, production requirements dictate that there is some minimum distance that die attach pad 207 must be space away from contact 209. The minimum distance will depend in large part on the nature of the substrate production process. In the leadless type packaging substrates described in the background (and as will be described in more detail below), the substrate sheet (which may take the form of a copper leadframe type sheet) is typically patterned by stamping, although in some situations they may be formed by chemical etching. In either case, production restraints require that there be some "minimum" distance between any two adjacent components. The appropriate "minimums" are not in any way fixed or absolute. However, as a rule of thumb, when copper is used as the substrate material, it is difficult to get the distance between adjacent components to be significantly smaller than the thickness of the substrate itself in large scale production environments.

Figure 5A:
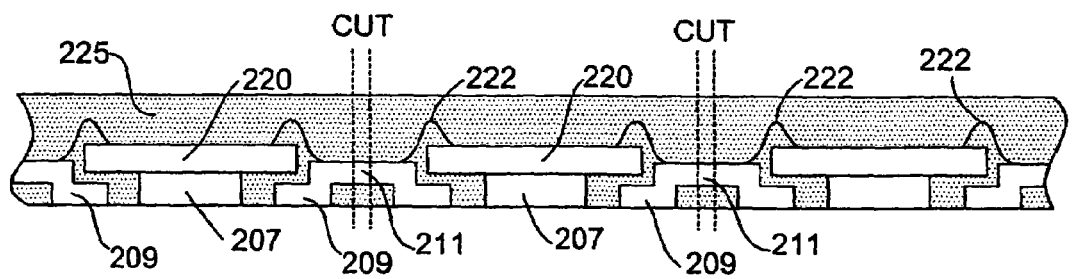
FIG. 5A is a diagrammatic cross sectional side view of a plurality of collectively capped die maximizing leadless leadframe package designs as illustrated in FIG. 3.

FIG. 5A is a diagrammatic cross sectional side view of a plurality of collectively capped die maximizing leadless leadframe package designs as illustrated in FIG. 3. Each die attach pad 207 supports die 220 that is electrically connected via bond pads (not shown) to its associated contacts 209 by bonding wires 222. A single plastic cap 225 made of molding material encapsulates each die 220 and bonding wire 222 and fills the gaps between each die attach pad 207 and contact 209 thereby serving to hold each contact 209 in place. It should be appreciated that during singulation, tie bars 211 are cut and therefore the only materials holding contacts 209 in place is the molding material. The resulting packaged chip can then be surface mounted on a printed circuit board or other substrate using conventional techniques.

Figure 5B:
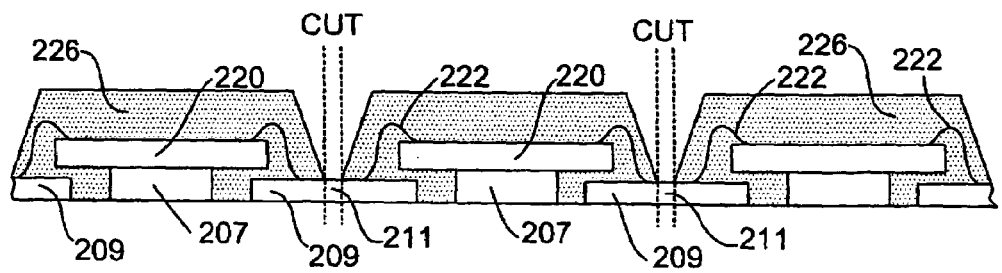
FIG. 5B is a diagrammatic cross sectional side view of a plurality of individually capped die maximizing leadless leadframe package designs as illustrated in FIG. 4.

FIG. 5B is a diagrammatic cross sectional side view of a plurality of individually capped die maximizing leadless leadframe package designs as illustrated in FIG. 4. Here, a single plastic cap 226 is used to individually encapsulate each die maximizing leadless leadframe package design. As with FIG. 5A, each die attach pad 207 supports die 220 that is electrically connected via bond pads (not shown) to its associated contacts 209 by bonding wires 222. Plastic cap 226 is made of molding material where it encapsulates each die 220 and bonding wire 222 and fills the gaps between each die attach pad 207 and contact 209 thereby serving to hold each contact 209 in place. Again, it should be appreciated that during singulation, tie bars 211 are cut and therefore the only materials holding contacts 209 in place is the molding material.

Figure 6A:
FIGS. 6A-6F are diagrammatic cross sectional side views illustrating steps involved in packaging an integrated circuit in accordance with one embodiment of the present invention.

Referring next to the sequence of FIGS. 6A-6F, a method of packaging an array of integrated circuits in accordance with various embodiments of the present invention will be described in more detail. A substrate sheet 200 is provided as illustrated in FIG. 6A. The substrate sheet is formed from a conductive material that is suitable for use as the package contacts. By way of example copper works well and is the material most commonly used in semiconductor packaging applications. However other materials such as aluminum and Alloy 42 may be used instead. The substrate sheet 200 may take any appropriate form factor. Today, much of the packaging handling equipment that is available is designed for handling leadframe strips and therefore, leadframe strips may be used as the substrate sheet. Alternatively, in many respects metal panels (e.g. copper panels) are more appropriate since they will typically have better rigidity and facilitate better space utilization. In the embodiment illustrated in FIG. 7, this type of substrate sheet 200 is used. The panels may take any form although substantially square or rectangular panels are expected to be the most common.

Figure 6B:
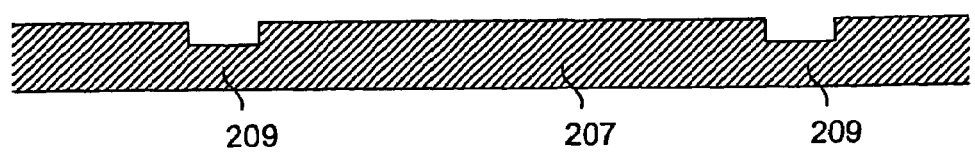
Figure 7:
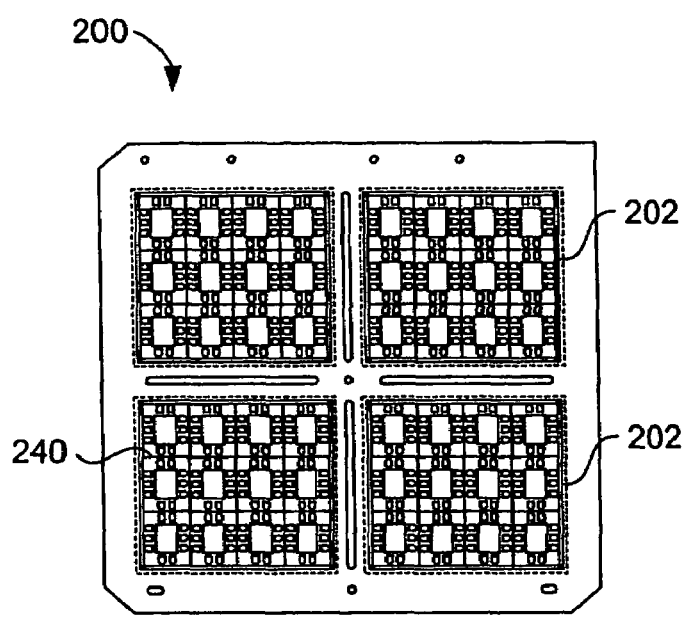
FIG. 7 is a diagrammatic top view of a substrate panel of FIG. 6C having a matrix of independent package areas.

Initially, the substrate sheet is patterned to form recesses in the regions of the substrate to be thinned as illustrated in FIG. 6B. The regions to be thinned will typically include at least the contacts 209. In embodiments where it is desirable to thin other features, those regions would be thinned as well. The thinning can be accomplished using a variety of conventional etching techniques. In one specific example a photo-lithographic based etch process may be used. However, it should be apparent that the techniques, chemistries and or processes used to etch (or grind or otherwise form) the recesses can be widely varied within the scope of the present invention.

After the panel 200 has initially been patterned to define the thinned regions, it is then fully patterned to form one or more arrays 202 of device areas 204 on the surface of panel 200. As a result, device areas 204 are typically suspended within panel 200. In the embodiment illustrated in FIG. 7, four arrays are illustrated in a panel type substrate panel 200. It should be appreciated that the number of arrays provided in any particular substrate panel and the number of device areas in each array may be very widely varied in accordance with the needs, constraints and optimizations of the particular manufacturing process. By way of example, arrays having from 3 to 20 devices on each side are commonly used, although larger arrays are possible and it is suspected that as technology develops, higher and higher densities having 50 or more devices on a side will be used.

Figure 6C:
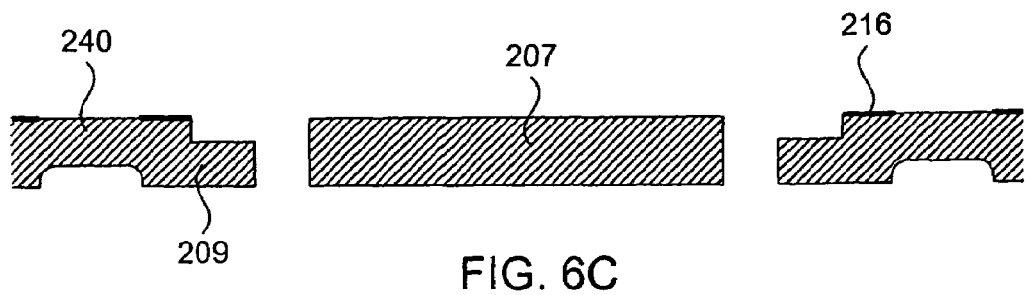
Figure 8:
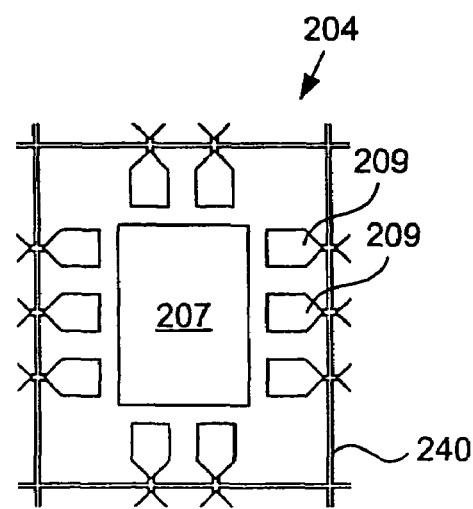
FIG. 8 is a diagrammatic top view of the substrate features associated with one of the independent package areas illustrated in FIG. 7.

Each device area 204 (illustrated in FIG. 8) has the appropriate surface features formed thereon. Typically, the desired surface features in each device area will include a plurality of contacts 209 and a die attach pad 207, as best illustrated in FIGS. 6C and 8. Tie bars 240 are also defined to support the desired surface features. The patterning may be done using any appropriate technology. Today, stamping and etching are the most common.

After substrate panel 200 has been patterned, it may optionally be plated with a material 216 that facilitates better wire bonding as described below. In the described embodiment, contacts 209 are selectively silver plated since as is well known to those skilled in the art, the gold bonding wires bond better with the silver plating than a copper substrate. In other embodiments alternative materials such as palladium-nickel (PdNi) may be plated to onto the contact pads to facilitate bonding. Of course, the actual plating materials used may be widely varied and a number of suitable materials are commercially available.

Figure 6D:
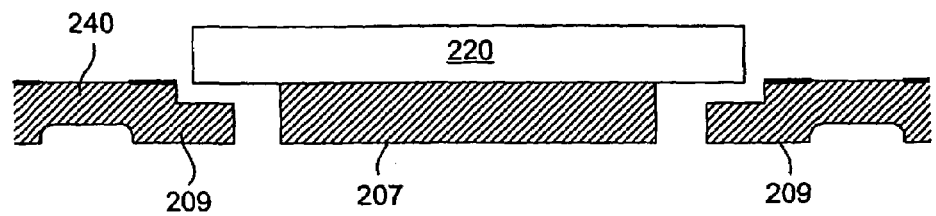

After any desired plating has been done, dice 220 are mounted on the die attach pads 207 using conventional die attachment techniques as illustrated in FIG. 6D. Generally, an adhesive or solder type material is used to secure the dice 220 to their respective die attach pads 207. For example, B-stageable non-conductive epoxy can be used. On the other hand, conductive epoxy can be used instead to facilitate heat dissipation from die 220 via die attach pad 207. Furthermore, fillers may be mixed in with the epoxy to create a known bond line thickness between die attach pad 207 and die 220. The advantage of using fillers in the epoxy will ensure that there will be a gap between the bottom of die 220 and the top surfaces of contacts 209 even if die 220 is slightly misaligned.

Figure 6E:
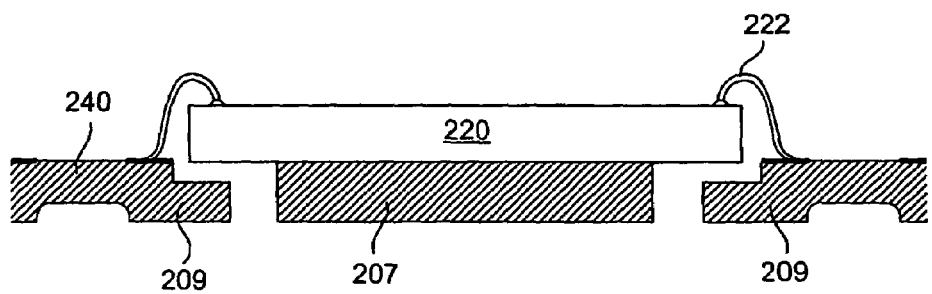

Thereafter, bond pads (not shown) on dice 220 are electrically connected to associated ones of contacts 209. In the embodiment shown, wire bonding (e.g., ball on die, wedge on contact) is used to electrically connect the dice to their associated contacts. Thus, as illustrated in FIG. 6E, bonding wires 222 electrically couple the dice 220 to the contacts 209. As suggested above, bonding wires are typically formed from gold. When gold bonding wires 222 are used in combination with a copper substrate, it is advantageous to silver (or otherwise) plate the contacts 209 to improve the adhesion of the bonding wires to the contacts.

Figure 6F:
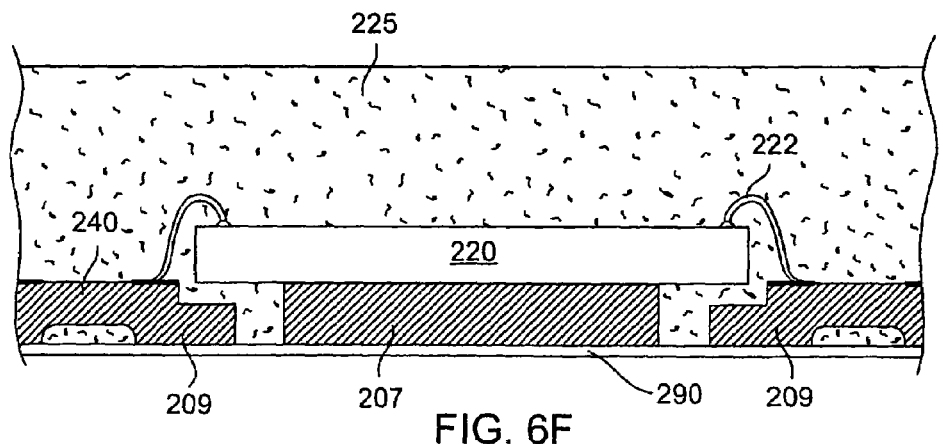

After all of the dice have been wire bonded or otherwise electrically connected to the appropriate contacts, a protective film 290 is applied to the bottom of substrate 200 before one or more plastic caps 225 are formed over substrate panel 200 as illustrated in FIG. 6F. Plastic caps 225 encapsulate die 220 and bonding wires 222 and fill the gaps between die attach pad 207 and contacts 209 thereby serving to hold the contacts in place. It should be appreciated that during subsequent singulation, tie bars 240 are cut. Therefore, after removing protective film 290, the only materials holding contacts 209 in place will be the molding material.

In the described embodiment, a separate plastic cap is formed over each separate array or matrix 202 of device areas 204. In the embodiment illustrated in FIG. 7, that would include four separate caps as outlined in dashed lines. However, it should be appreciated that a single cap or a different number of caps can readily be provided.

As will be appreciated by those skilled in the art, one potential disadvantage to having a single very large cap 225 that covers a large array on a single large panel is that the cap may induce stresses that adversely affect the dice. Thus, when molding over large panels it is common to logically separate the panel into a plurality of regions (e.g. the separate arrays) in order to reduce the impact of such induced stresses. However, it should be apparent that when the component design parameters and molding process control permits, a single cap may be provided.

In other embodiments, a relatively larger number of caps 225 may be molded over the surface of the substrate panel. One drawback of having too many caps is that in order to form separate caps, a greater spacing is required between adjacent device areas 204 that are under different caps than would be required for adjacent device areas 204 under the same cap. Thus, the density of devices that can be packaged on a particular substrate panel is reduced.

The caps 225 may be formed using any conventional molding process including transfer molding and injection molding. In the described embodiment, a molded array type transfer molding process is used.

After the caps 225 have been formed, any additional process steps that are desired may be performed. As will be appreciated by those skilled in the art, these may include solder plating the exposed surfaces of the contacts 209, adding bumps to the exposed contacts 209, or singulating the packaged integrated circuits. The resulting packaged chips can then be surface mounted on printed circuit boards or other appropriate substrates and/or devices using conventional techniques.

Figure 9A:
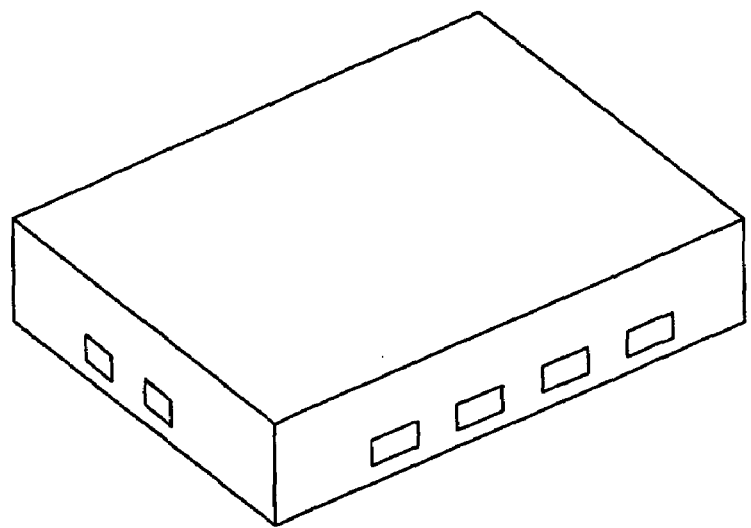
FIGS. 9A and 9B are perspective top and bottom views respectively of finalized packaged devices in accordance with one embodiment of the present invention.
Figure 9B:
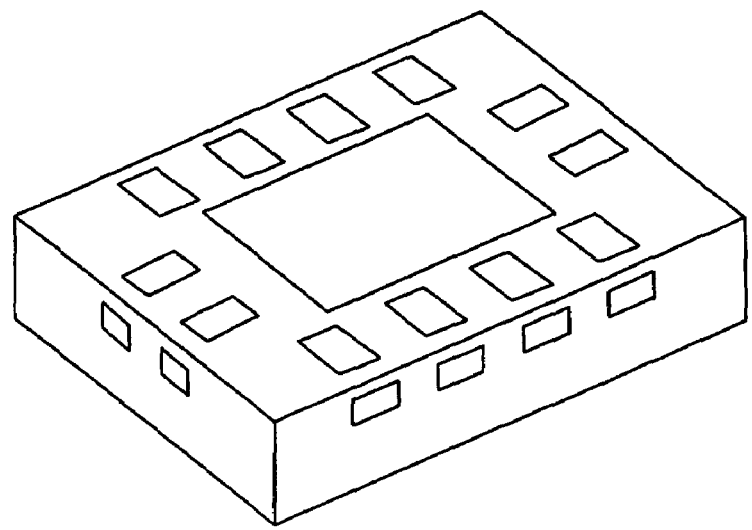

FIGS. 9A and 9B are perspective top and bottom views respectively of finalized packaged devices in accordance with one embodiment of the present invention.

Although the foregoing invention has been described in some detail for purposes of clarity of understanding, it will be apparent that certain changes and modifications may be practiced within the scope of the appended claims. For example, substrate 200 can be configured for a square or rectangular leadless leadframe package as well as for dual (contacts on two sides) or quad (contacts on four sides) formats. Likewise, multiple dice may have only one corresponding die attach pad 207. For instance, the corresponding die attach pad 207 may either have a die stacked vertically on top of another die or have a die placed laterally adjacent to another die or both. In addition, reverse wire bonding can be used in conjunction with any of the described embodiments. A number of conventional package processing techniques have been described as being used to accomplish specific steps in the formation of the described devices. It should be apparent that in most cases these processing techniques can be widely varied and a wide variety of alternative conventional processes may be used in their place. Accordingly, the present embodiments are to be considered as illustrative and not restrictive, and the invention is not to be limited to the details given herein, but may be modified within the scope and equivalents of the appended claims.

We claim:

1. A method, comprising:
   forming a lead frame panel suitable for use in forming integrated circuit packages, including forming a plurality of device areas within the lead frame panel that are arranged in a two dimensional array, each device area having a die attach pad, and a plurality of corresponding electrical contacts surrounding the die attach pad, each contact having an inner region and an outer region,
   wherein the outer region is a portion of the contact positioned horizontally adjacent to the periphery of the device area, and
   wherein the inner region is a portion of the contact positioned horizontally adjacent to both the die attach pad and the outer region, the inner region having
      a vertical height relative to a bottom surface of the lead frame panel that is less than a vertical height of a topmost surface of the die attach pad, and
      a vertical thickness between a top surface of the inner region and a bottom surface directly opposite the top surface of the inner region that is less than a vertical thickness between a top surface of a thickest portion of the die attach pad and a bottom surface directly opposite the top surface of the thickest portion of the die attach pad,
   wherein bottom surfaces of the die attach pads are substantially coplanar with bottom surfaces of the electrical contacts.

2. The method as recited in claim 1, further comprising:
   for each device area, selecting a die having a footprint that is larger than a footprint of the corresponding die attach pad and attaching the die to the corresponding die attach pad such that peripheral portions of the die overhang at least a portion of the inner region of a contact.

3. The method as recited in claim 2, further comprising:
   for each device area, connecting the die to the plurality of corresponding electrical contacts with wire bonds;
   forming a molded cap over at least one of the plurality of device areas; and
   singulating the substrate into a plurality of individual integrated circuit packages.

4. The method as recited in claim 2, wherein the peripheral portions of the die do not overhang above the outer regions of the corresponding electrical contacts surrounding the corresponding die attach pad.

5. The method as recited in claim 2, wherein the outer regions of the electrical contacts have a vertical height relative to the bottom surface of the lead frame panel that is less than that of the die attach pad and a vertical thickness that is less than that of the die attach pad and wherein the peripheral portions of the die do not overhang above the outer regions of the corresponding electrical contacts surrounding the corresponding die attach pad.

6. The method as recited in claim 2, wherein the outer regions of the electrical contacts have a vertical height relative to the bottom surface of the lead frame panel that is substantially equal to that of the die attach pad and wherein the peripheral portions of the die do not overhang above the outer regions of the corresponding electrical contacts surrounding the corresponding die attach pad.

7. The method as recited in claim 1, wherein the thickness between the top surface of the die attach pad and the bottom surface of the die attach pad is substantially uniform throughout the die attach pad.

8. The method as recited in claim 1, wherein the entire bottom surface of the die attach pad is substantially coplanar with the bottom surface of the inner region of the contact.

9. A semiconductor package for maximizing a die size made by the process of:
   forming a plurality of device areas arranged in a two dimensional array and suspended within an electrically conductive substrate, each device area having a die attach pad, and a plurality of corresponding electrical contacts surrounding the die attach pad, each contact having an inner region and an outer region, and
   attaching a die to the die attach pad of an associated device area, the die having a footprint that is larger than a footprint of the associated die attach pad such that peripheral portions of the die overhang at least a portion of the inner region of a contact; and
   wherein the outer region is a portion of the contact positioned horizontally adjacent to the periphery of the device area, and
   wherein the inner region is a portion of the contact positioned horizontally adjacent to both the die attach pad and the outer region, the inner region having
      a vertical height relative to a bottom surface of the lead frame panel that is less than a vertical height of a topmost surface of the die attach pad, and
      a vertical thickness between a top surface of the inner region and a bottom surface directly opposite the top surface of the inner region that is less than a vertical thickness between a top surface of a thickest portion of the die attach pad and a bottom surface directly opposite the top surface of the thickest portion of the die attach pad,
   wherein bottom surfaces of the die attach pads are substantially coplanar with bottom surfaces of the electrical contacts.

10. The method as recited in claim 9, further comprising:
    for each device area, connecting the die to the plurality of corresponding electrical contacts with wire bonds;
    forming a molded cap over at least one of the plurality of device areas; and
    singulating the substrate into a plurality of individual integrated circuit packages.

11. The method as recited in claim 9, wherein the peripheral portions of the die do not overhang above the outer regions of the corresponding electrical contacts surrounding the corresponding die attach pad.

12. The method as recited in claim 9, wherein the outer regions of the electrical contacts have a vertical height relative to the bottom surface of the lead frame panel that is less than that of the die attach pad and a vertical thickness that is less than that of the die attach pad and wherein the peripheral portions of the die do not overhang above the outer regions of the corresponding electrical contacts surrounding the corresponding die attach pad.

13. The method as recited in claim 9, wherein the outer regions of the electrical contacts have a vertical height relative to the bottom surface of the lead frame panel that is substantially equal to that of the die attach pad and wherein the peripheral portions of the die do not overhang above the outer regions of the corresponding electrical contacts surrounding the corresponding die attach pad.

14. The method as recited in claim 9, wherein the thickness between the top surface of the die attach pad and the bottom surface of the die attach pad is substantially uniform throughout the die attach pad.

15. The method as recited in claim 9, wherein the entire bottom surface of the die attach pad is substantially coplanar with the bottom surface of the inner region of the contact.

* * * * *